United States Patent [19]
Drost et al.

[11] Patent Number: 6,148,038
[45] Date of Patent: Nov. 14, 2000

[54] CIRCUIT FOR DETECTING AND DECODING PHASE ENCODED DIGITAL SERIAL DATA

[75] Inventors: Robert J. Drost, Palo Alto; Robert J. Bosnyak, San Jose, both of Calif.

[73] Assignee: Sun Microsystems, Inc., Mountain View, Calif.

[21] Appl. No.: 08/828,506

[22] Filed: Mar. 31, 1997

[51] Int. Cl.[7] .............................. H04L 27/22; H03D 3/00
[52] U.S. Cl. ...................... 375/324; 375/316; 329/345
[58] Field of Search ..................... 375/371, 375, 375/373, 324, 360, 365, 355, 366; 370/517, 518, 519; 341/50, 51; 329/345, 346

[56] References Cited

U.S. PATENT DOCUMENTS

| | | | |
|---|---|---|---|
| 4,302,845 | 11/1981 | McClaughry et al. | 375/238 |
| 4,782,484 | 11/1988 | Limb | 375/355 |
| 4,881,059 | 11/1989 | Saltzberg | 341/70 |
| 4,984,255 | 1/1991 | Davis et al. | 375/360 |
| 5,003,562 | 3/1991 | Van Driest et al. | 375/327 |
| 5,619,541 | 4/1997 | Vann Brunts et al. | 375/360 |
| 5,663,991 | 9/1997 | Kelkar et al. | 375/376 |
| 5,689,533 | 11/1997 | Brauns et al. | 375/360 |
| 5,881,100 | 3/1999 | Durrant et al. | 375/208 |

FOREIGN PATENT DOCUMENTS

0425302 A2  5/1991  European Pat. Off. .

OTHER PUBLICATIONS

EPO Search Report.

*Primary Examiner*—Chi H. Pham
*Assistant Examiner*—Khai Tran
*Attorney, Agent, or Firm*—Finnegan, Henderson, Farabow, Garrett & Dunner, L.L.P.

[57] ABSTRACT

A decoder circuit for decoding phase-encoded digital data signals includes a timing circuit and a signal viewer circuit coupled to logic circuitry. The timing circuit uses an edge of a received phase-encoded digital data signal to indicate when to sample data from the received phase-encoded digital data signal in the signal viewer circuit. The logic circuitry determines the value encoded in the phase-encoded digital data signal based on the sampled data.

55 Claims, 12 Drawing Sheets

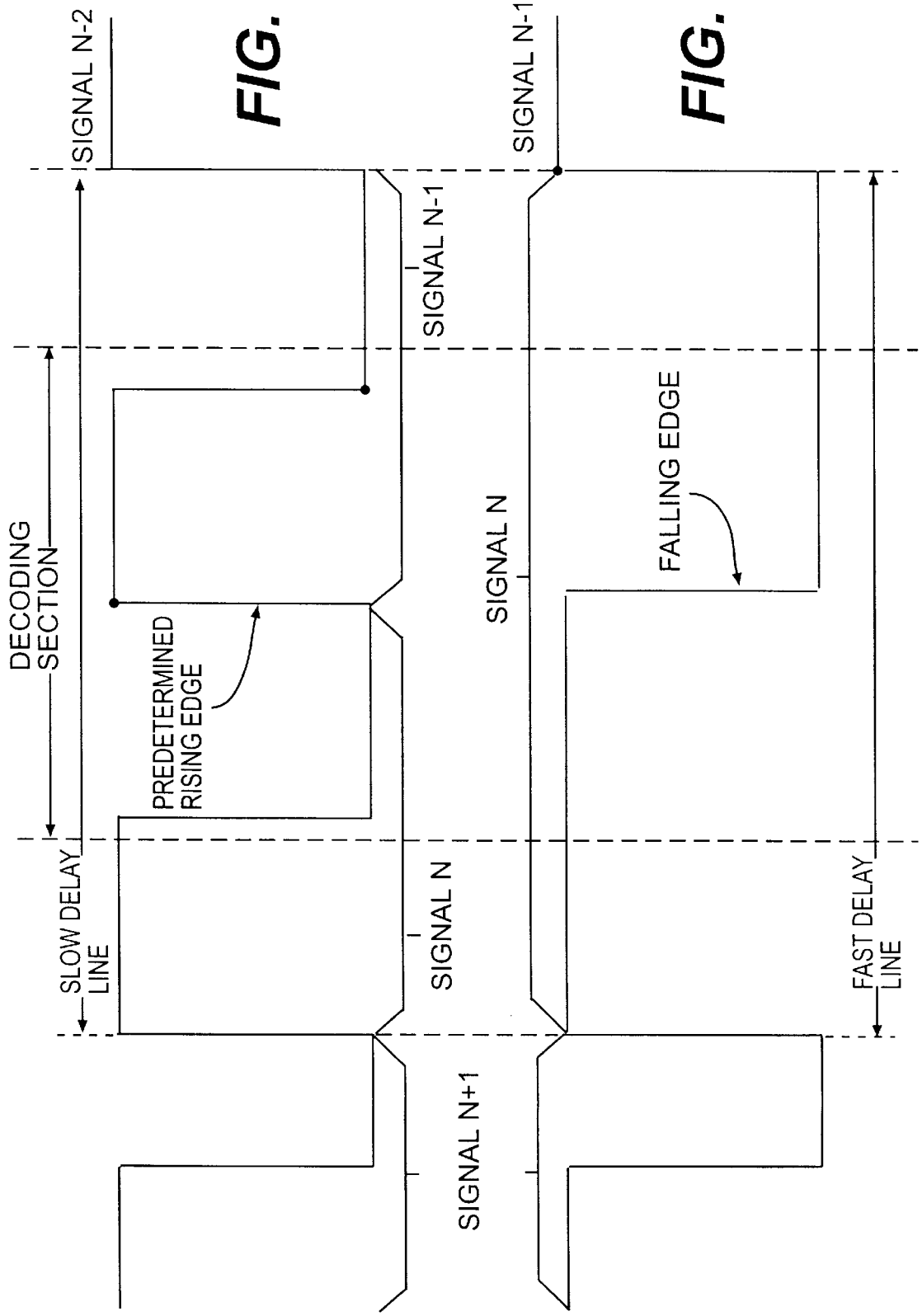

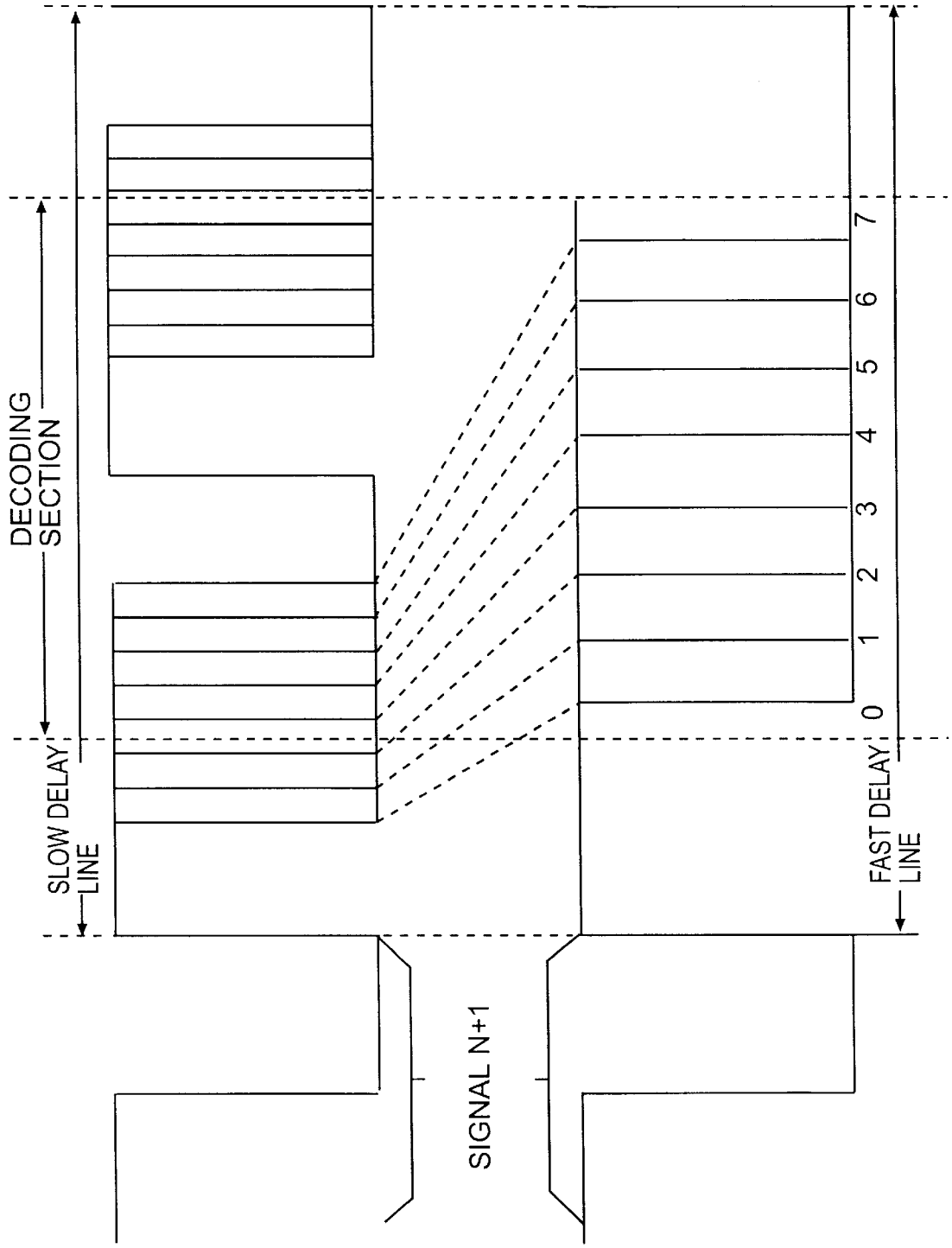

| | 7 | 6 | 5 | 4 | 3 | 2 | 1 |
|---|---|---|---|---|---|---|---|
| DREG OUTPUT | 0 | (0) | X | X | X | X | X |
| SLOW DELAY LINE | 0 | (0/1) | 1 | 1 | 1 | 1 | 1 |
| FAST DELAY LINE | 0 | (0) | 0 | 0 | 0 | 0 | 0/1 |

FIG. 7A

| | 7 | 6 | 5 | 4 | 3 | 2 | 1 |
|---|---|---|---|---|---|---|---|
| DREG OUTPUT | 0 | 0 | (0) | X | X | X | X |
| SLOW DELAY LINE | 0 | 0 | (0/1) | 1 | 1 | 1 | 1 |
| FAST DELAY LINE | 1 | 1 | (0) | 0 | 0 | 0 | 0 |

FIG. 7B

| | 7 | 6 | 5 | 4 | 3 | 2 | 1 |
|---|---|---|---|---|---|---|---|
| DREG OUTPUT | 0 | 0 | 0 | (1) | X | X | X |
| SLOW DELAY LINE | 0 | 0 | 0 | (0/1) | 1 | 1 | 1 |
| FAST DELAY LINE | 1 | 1 | 1 | (1) | 0 | 0 | 0 |

FIG. 7C

| | 7 | 6 | 5 | 4 | 3 | 2 | 1 |
|---|---|---|---|---|---|---|---|
| DREG OUTPUT | 0 | 0 | 0 | 1 | (1) | X | X |
| SLOW DELAY LINE | 1 | 0 | 0 | 0 | (0/1) | 1 | 1 |
| FAST DELAY LINE | 1 | 1 | 1 | 1 | (1) | 1 | 0 |

FIG. 7D

CIRCUIT FOR DETECTING AND DECODING PHASE ENCODED DIGITAL SERIAL DATA

BACKGROUND OF THE INVENTION

The present invention relates generally to the field of digital data communication, and more particularly to the field of detecting and decoding phase-encoded data from a digital serial bit stream.

In order to detect and decode serial data, data communication systems have used a clock recovery circuit (CRC) to generate a clock signal from the transmitted data because the systems do not transmit a separate clock signal. A CRC may, for example, detect both positive and negative transitions of the data to generate a clock signal at the fundamental frequency of the serial data.

This type of edge-detection CRC has some drawbacks. When the serial data is in non-return to zero (NRZ) format, consecutive ones and zeros do not provide edges for the CRC to detect. During these periods, the CRC must maintain a clock at a previously determined rate and avoid any drift in the recovered clock frequency.

Another problem arises from random jitter and noise error introduced into the transmitted data stream. As data rates increase, the ability of the CRC to maintain an accurate clock to allow the data recovery circuit to recover the received data becomes more difficult because the tolerances become tighter.

One way to increase data rates without a higher clock frequency is to encode the data differently, such as with phase-encoding. Although many conventional serial data systems encode data bits as high and low levels of a data signal, phase-encoding encodes data bits by adjusting a duty cycle of the signal. Unlike the traditional level coding, phase encoding represents data by duty cycle.

FIG. 1A shows a data signal with a 50/50 duty cycle, where the data signal is high 50% of the cycle and low 50% of the cycle. FIG. 1B shows an example of a data signal with eight duty cycles or phase positions. Each position represents one of eight values, or three bits of data. The phase positions are centered around the 50% duty cycle to minimize bandwidth. Thus, the phase positions cover a particular range of the duty cycle, equal to 50%±X%. For example, if X is 25, then phase position 0 would have a 25/75 duty cycle and represent 000, and phase position 7 would have a 75/25 duty cycle and represent 111.

Although phase-encoding allows data to be sent at a higher rate than standard data encoding, the receiving circuit must still extract a clock signal from the data. Conventional decoders of phase-encoded data signals use a phase-locked loop to produce a clock signal. The decoder uses the clock signals from the phase-locked loop to sample and decode received phase-encoded data signals. These decoders, however, still suffer from jitter and noise that can affect the decoding of the phase-encoded data.

Therefore, a phase-encoded data decoder is needed to obtain decoded data reliably.

SUMMARY OF THE INVENTION

A decoder circuit consistent with this invention optimizes the decoding of phase-encoded digital data signals with no clock signal by passing the phase-encoded digital data signal through circuit elements, such as delay lines having different delays. The decoder does this to determine the values encoded by the phase-encoded digital data signals both quickly and accurately.

The following description, as well as the practice of the invention, set forth and suggest additional advantages and purposes of this invention.

More specifically, a decoder circuit, consistent with this invention, for decoding a phase-encoded digital data signal includes a timing circuit receiving the phase-encoded digital data signal, a signal viewer circuit receiving the phase-encoded digital data signal, and a decoder logic circuit, coupled to the timing circuit and signal viewer circuit, configured to sample the phase-encoded digital data signal in the signal viewer circuit at times determined by the timing circuit to extract a value encoded in the received phase-encoded digital data signal.

Another decoder circuit, consistent with this invention, for decoding a phase-encoded digital data signal includes a first delay line receiving the phase-encoded digital data signal, a second delay line operating at a different rate than the first delay line and receiving the phase-encoded digital data signal, and a decoder logic circuit, coupled to the first and second delay lines, configured to sample the phase-encoded digital data signal in the second delay line at times determined by the first delay line to extract a value encoded in the received phase-encoded digital data signal.

Both the foregoing general description and the following detailed description provide examples and explanations only. They do not restrict the claimed invention.

DESCRIPTION OF THE DRAWINGS

The accompanying drawings, which are incorporated in and constitute a part of this specification, illustrate embodiments of the invention and, together with the description, explain the advantages and principles of the invention. In the drawings.

FIGS. 4A and 4B are diagrams of phase-encoded digital data signals passing through a slow delay line and a fast delay line, respectively, of FIG. 2B.

FIGS. 5A and 5B are diagrams of phase-encoded data signals and their eight phase positions passing through the slow delay line and the fast delay line, respectively, of FIG. 2B.

FIGS. 7A–7D are a binary representation of the stages shown in FIGS. 6C–6F, respectively.

DESCRIPTION OF THE PREFERRED EMBODIMENT

Figure 1A:
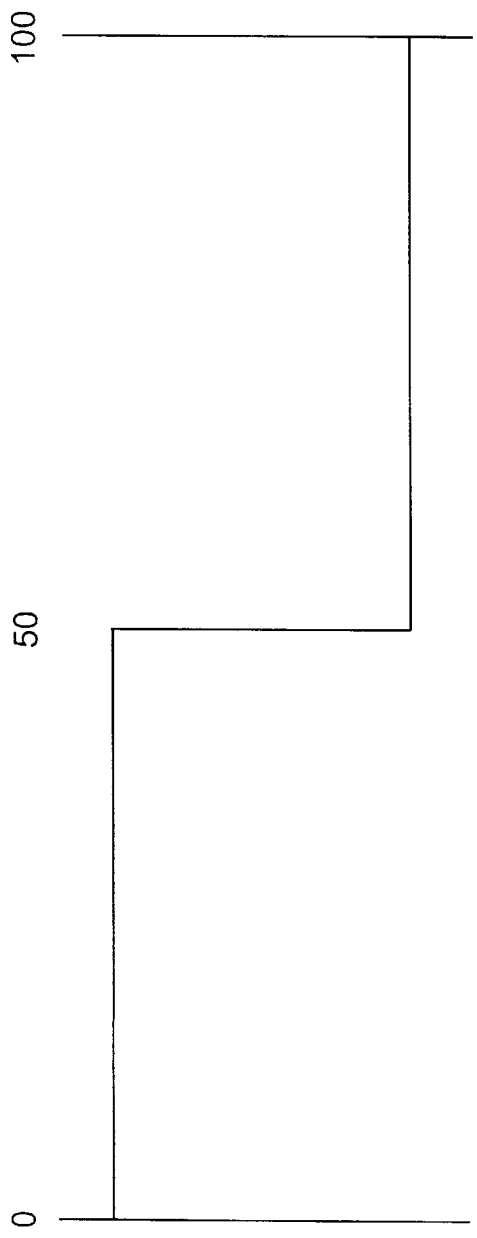
FIG. 1A is a diagram of a digital data signal with a 50/50 duty cycle.

Reference will now be made to preferred embodiments of this invention, examples of which are shown in the accompanying drawings. Other examples will be obvious from the description of the invention. In the drawings, the same reference numbers represent the same or similar elements in the different drawings whenever possible.

Figure 2A:
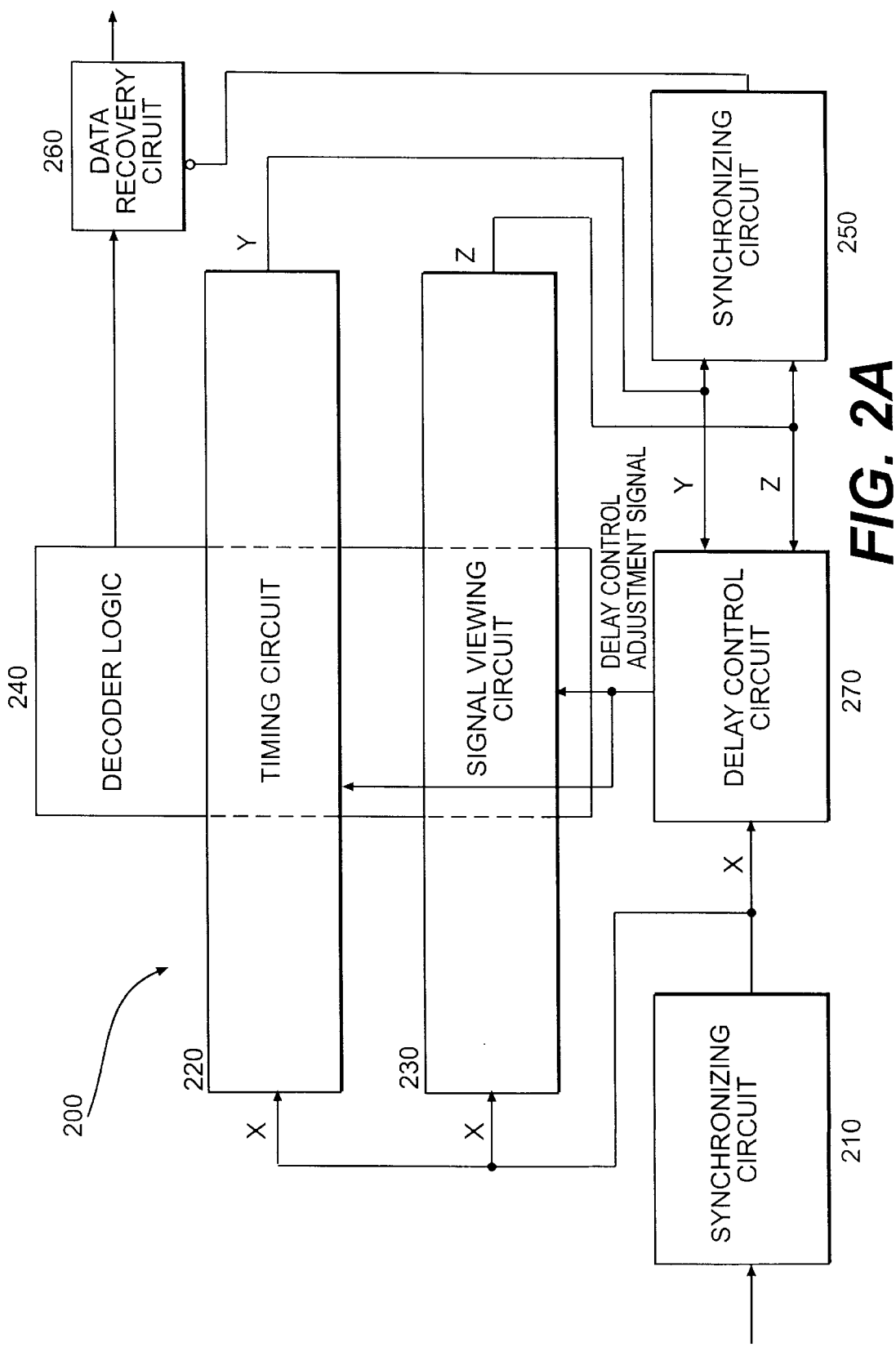
FIGS. 2A and 2B are block diagrams of the decoder circuit for phase-encoded data consistent with the present invention.

FIG. 2A shows a block diagram of a decoder 200 consistent with the present invention for extracting data from a phase-encoded digital data signal. Decoder 200 includes synchronizing circuits 210 and 250, a timing circuit 220, a signal viewer circuit 230, a decoder logic circuit 240, a data recovery circuit 260, and a delay control circuit 270.

Timing circuit 220, signal viewer circuit 230, and delay control circuit 270 each receive the phase-encoded digital data signal X from synchronizing circuit 210. Decoder logic circuit 240 is coupled to timing circuit 220 and signal viewer circuit 230 to extract the data from the encoded signal for data recovery circuit 260. Timing circuit 220 produces an output signal Y and signal viewer circuit 230 produces an output signal Z. Synchronizing circuit 250 and delay control circuit 270 each receive output signals Y and Z. Synchronizing circuit 250 generates a store signal for data recovery circuit 260, and delay control circuit 270 generates a delay control adjustment signal for timing circuit 220 and signal viewer circuit 230.

In operation, each phase-encoded data signal corresponds to one duty cycle, so each phase-encoded signal encodes a single value. Synchronizing circuit 210, which may include a phase-locked loop (PLL) or a delay locked loop (DLL), aligns the phase-encoded digital data signals at the input of timing circuit 220 and signal viewer circuit 230. It also conditions the signal levels in the received signal to correct disturbances arising during transmission of the encoded signal.

Timing circuit 220 uses the rising or timing edge, formed by the end of a previous phase-encoded digital data signal and the beginning of a received phase-encoded digital data signal, as a clock signal to indicate to decoder logic circuit 240 when to sample the phase-encoded digital data signal present in signal viewer 230. Decoder logic circuit 240 takes eight samples of the signal at different times and uses seven of these samples to determine which signal phase is encoded in each cycle. Decoder logic circuit 240 then forms a three-bit number corresponding to that phase, and data recovery circuit 260 stores the three-bit number after the rising edge of the signal from timing circuit 220 causes synchronizing circuit 250 to issue a store signal.

Figure 2B:
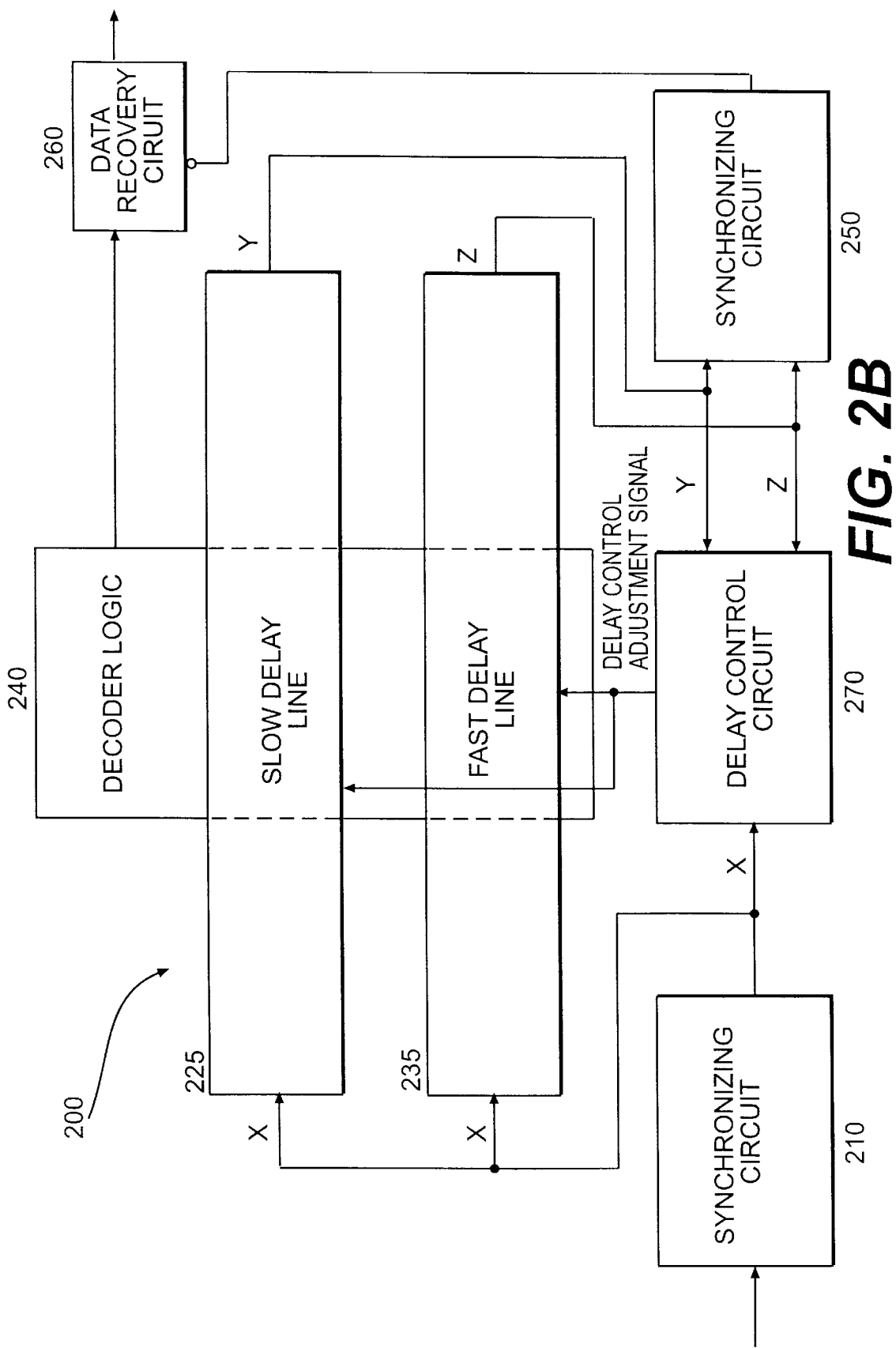

Delay control circuit 270 uses the phase-encoded digital data signal X and output signals Y and Z to generate the delay control adjustment signal. This signal adjusts the delay timings in timing circuit 220 and signal viewer circuit 230 to ensure the accurate decoding of the received phase-encoded digital data signal. FIG. 2B shows decoder 200 as having a slow delay line 225 as timing circuit 220, and a fast delay line 235 as signal viewer circuit 230.

In operation, delay control circuit 270 can use phase detectors to compare the phases of signal X and signal Z using the rising edges of each signal. Delay control circuit 270 aligns these edges to ensure that slow delay line 225 contains one bit period or one full cycle of a phase-encoded digital data signal. Using signals X and Y, delay control circuit 270 can produce a separate signal for adjusting the delay within fast delay line 235 to ensure fast delay line 235 contains two bit periods. Alternatively, if slow delay line 225 is implemented with twice as many delay gates as fast delay line 235, delay control circuit could produce just one delay adjustment control signal using either signals X and Y or signals X and Z to adjust the bit periods in each delay line.

Delay control circuit 270 can be implemented as, for example, a delay locked loop, a phase locked loop, or a frequency locked loop.

Figure 3:
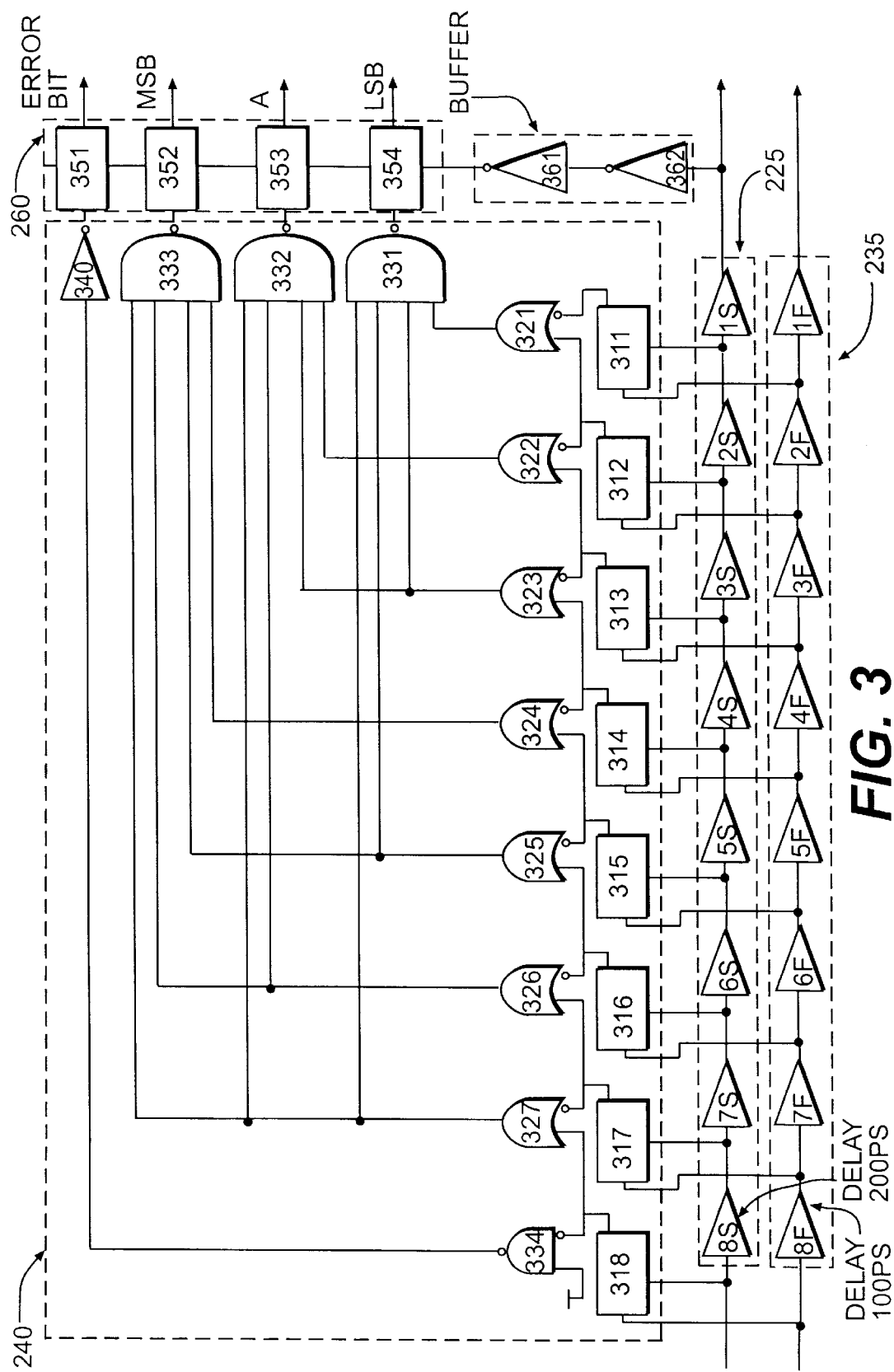
FIG. 3 is a detailed diagram of the delay lines, decoder logic circuit, and data recovery circuit of the decoder in FIG. 2B.

FIG. 3 shows a more detailed illustration of elements 225, 235, 240, and 260 in decoder 200. In the decoding section, each delay line includes a set of eight series-coupled delay gates. Delay gates 1S–8S in slow delay line 225 each delay signals by the same amount, for example, 200 ps. Delay gates 1F–8F also delay signals by an equal amount, although generally by half the delay amount of the gates in slow delay line 225, for example, 100 ps. Delay lines 225 and 235 also include delay gates before and after the decoding section. The number of delay gates before and after the decoding section depends on the percentage of the signal used for phased encoding.

The delay gates in delay lines 225 and 235 are adjustable. For example, delay gates 1F–8F could be set between 10 ps and 100 ps, and delay gates 1S–8S could be set between 20 ps and 200 ps. The delay gates are adjusted based on the delay control adjustment signal to accommodate the varying frequencies of phase-encoded digital data signals received by decoder 200. To make the delay gates adjustable, they may be implemented as, for example, current starved inverters.

At any one time, slow delay line 225 includes two full cycles or bit periods of a phase-encoded digital data signal, whereas fast delay line 235 only includes one cycle of a phase-encoded digital data signal. The delay of each of the delay gates and the total number of delay gates present in each delay line depends upon the period of the phase-encoded digital data signal and the percentage of the period devoted to the phase codings. For example, if the period is 1400 ps and the percentage of the period for phase encodings is 50% (50±25%), each delay gate in fast delay line 235 would have a 100 ps delay and fast delay line 235 would have fourteen delay gates total. Each delay gate in slow delay line 225 would have a 200 ps delay and slow delay line 225 also would have fourteen delay gates total. Of the fourteen delay gates, three delay gates would be before the decoding section and three delay gates would be after the decoding section. Regardless of the total number of delay gates in the delay lines, the delay amount before and after the decoding section must be equal. As an alternative to having an equal number of delay gates with twice the delay, slow delay line 225 could have twice the number of delay gates as fast delay line 235, with each delay gate having the same delay.

To calculate the delay amounts before the decoding section, within the decoding section, and after the decoding section, first multiply the percentage by the period. Then, multiply that product by the fraction 8/7. Thus, for the above period and percentage, the first product would be 700 ps (1400×50%), and the second product would be 800 ps. The second product represents the delay in the decoding section in fast delay line 235. Twice that product represents the delay in the decoding section of slow delay line 225. Next, subtract the second product from the period, resulting in a difference of 600 ps. In fast delay line 235, half of this difference is for the delay before the decoding section and the other half is for the delay after the decoding section. For slow delay line 225, each of the delays before and after the decoding section is double that of fast delay line 235. The delay for each delay gate within the decoding section of each delay line is equal to the delay for the decoding section divided by eight.

Decoder logic circuit 240 includes a set of eight D registers (DREGs) 311–318, a set of seven OR gates 321–327, a set of four NAND gates 331–334, and an inverter 340. The input of each delay gate of slow delay line 225 connects to a clock input of a corresponding one of the eight DREGs. For instance, the input of delay gate 7S is coupled to the clock input of DREG 317. In addition, the input of each corresponding delay gate of fast delay line 235 connects to a D-input of a corresponding one of the DREGs. Thus, the input of delay gate 7F is coupled to the D-input of DREG 317.

As explained below in greater detail, when the rising edge of the encoded signal reaches a stage in slow delay line 225, the corresponding DREG captures the level of the signal at that stage in fast delay line 235. The DREGs will begin to capture a high signal level at an earlier time if the encoded signal has a higher encoded value.

The Q-outputs of DREGs 312–317 each connect to an input of a pair of adjacent OR gates, and one of the inputs is always inverted. For example, the Q-output of DREG 317 connects to an inverted input of OR 327 and a non-inverted input of OR 326. The Q-output of DREG 311 only connects to an inverted input of OR 321. The inverted Q-output of DREG 318 is coupled to a non-inverted input of OR 327 and an inverted input of NAND 334. The non-inverted input of NAND 334 connects to Vdd, holding this input at a constant high voltage level. The output of NAND 334 connects to an inverter 340. The OR gates operate as edge detectors because one input is inverted. Thus, the output at each OR gate is low only when one input is low end the other is high. Inverter 340, in conjunction with NAND gate 334, operate to output a signal level representing the error condition latched by DREG 318.

Figure 1B:
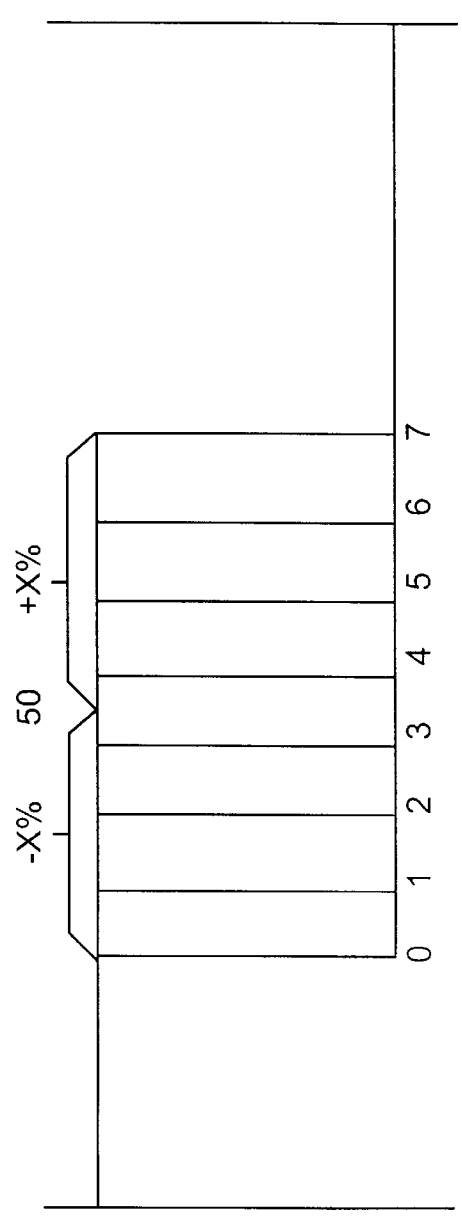
FIG. 1B is a diagram of a digital data signal having eight phase positions.

Because the falling edge of the signal in FIG. 1B corresponds to a phase position and the OR gates operate as edge detectors, the outputs of the OR gates indicate the phase position of a phase-encoded digital data signal. For each phase-encoded signal, only one OR gate produces a low signal because each signal has only one edge in the phase encoding position. The outputs of the OR gates are selectively coupled to NAND gates 331–333, which encode the OR gate output into a three-bit signal.

The rising edge of a phase-encoded signal received by slow delay line 225 at the input of delay gate 8S sets DREG 318 to latch the input at delay gate 8F. Under normal circumstances, the input at delay gate 8F will be low because the falling edge of the phase-encoded digital data signal being decoded should not have reached delay gate 8F. In this situation, the Q-output of DREG 318 passes a low signal to the inverted input of NAND gate 334, and NAND gate 334 outputs a low signal. Inverter 340 inverts this low signal to a high signal indicating no error has occurred. DREG 318 latching a high signal from the input of delay gate 8F would indicate that the falling edge of the phase-encoded signal has already reached the input of delay gate 8F, meaning that the phase-encoded signal has not been aligned at the inputs of delay lines 225 and 235. This would be an error, and DREG 318 would latch a "one." Inverter 340 would then output a low signal, indicating an error has occurred.

Data recovery circuit 260 includes a set of four DREGs 351–354 to hold the decoded data. The D-input of DREG 351 receives a signal from the output of inverter 340, and the D-input of DREGs 352–354 receive the output from NAND gates 333–331, respectively, of decoder logic circuit 240. Each DREG in data recovery circuit 260 is clocked according to the buffered rising edge output from delay gate 1S. This occurs after all the DREGs 311–318 have been set.

The design of fast delay line 235 and slow delay line 225 ensures that the rising or timing edge, formed by the previous phase-encoded digital data signal and the received phase-encoded digital data signal, in slow delay 225 enters the decoding section shown in FIG. 3 just before the phase encoding section of the received phase-encoded digital data signal enters the decoding section. The phase encoding section is the section of the signal where the phase information is located, for example, the central 50% of the signal. FIGS. 4A and 4B show the passage of phase-encoded digital data signals through slow delay line 225 and fast delay line 235, respectively. FIGS. 5A and 5B show representations similar to FIGS. 4A and 4B, respectively, but with signals encoding values 0–7 shown in FIG. 1B.

To illustrate the operation of decoder 200 in greater detail, FIGS. 6A–6F show an example of a progression of a received phase-encoded data signal, representing a "4," through delay lines 225 and 235. The vertical solid line on the left represents the state of the signal at the input of delay gates 8S and 8F. The vertical solid line on the right represents the state of the signal at the output of delay gates 1S and 1F. Thus, the vertical solid lines corresponds to the signal present in the decoding section of slow delay line 225 and fast delay line 235. The vertical dashed lines represent the state of the signal at the inputs of delay gates 7S–1S and 7F–1F. The labels above the vertical lines correspond to the registers connected to the delay lines. For example, "Error" corresponds to DREG 318, "7" corresponds to DREG 317, and so on to where 1 corresponds to DREG 311. The spaces between the vertical lines represent the delays imparted by each of the delay gates of slow delay line 225 and fast delay line 235. In addition, the signals before and after the decoding section represent the signals present in the delay lines, but not within the decoding section.

In each figure of FIGS. 6A–6F, the open circle in slow delay line 225 indicates when the rising edge actually clocks the corresponding DREG. The solid circle in fast delay line 235, connected to the open circle, indicates the corresponding signal level in fast delay line 225 that is clocked by the corresponding DREG. As shown in FIGS. 6A–6F, slow delay line 225 includes two full cycles of a phase-encoded digital data signal, and fast delay 235 includes one full cycle of a phase-encoded digital data signal. In addition, for this example, each phase-encoded digital data signal has a 1400 ps period, the phase encoding is for 50% of the signal, each delay gate in slow delay line 225 has a 200 ps delay, and each delay gate in fast delay line 235 has a 100 ps delay. Therefore, based on a 1400 ps period and 50% phase encoding, each delay line has fourteen delay gates.

Figure 6A:
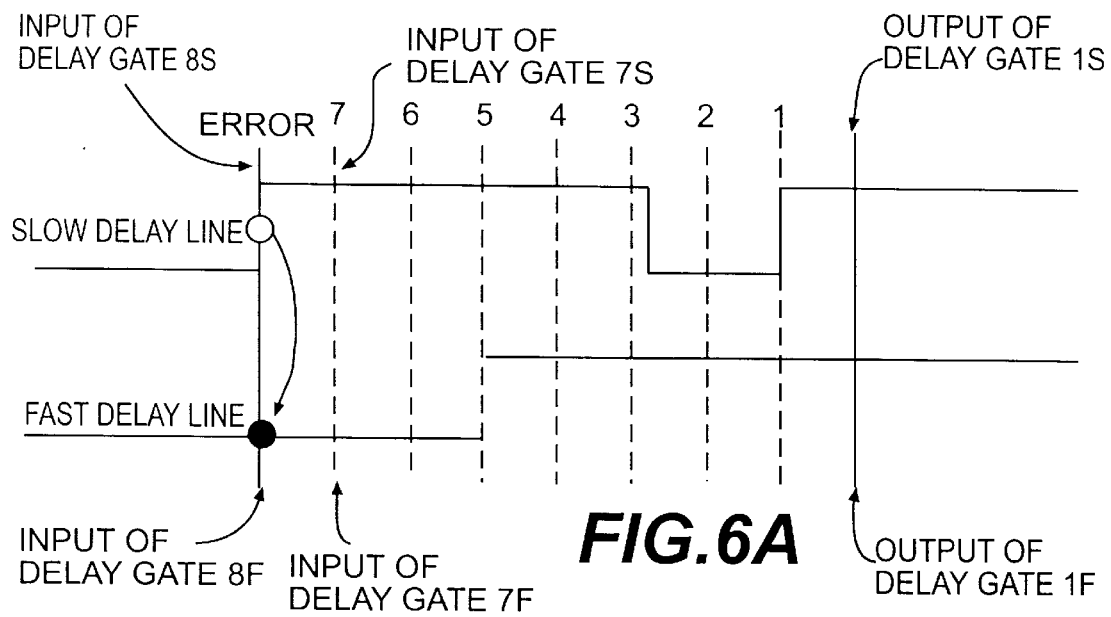
FIGS. 6A–6F are diagrams showing stages of progression of a phase-encoded digital data signal through the slow delay line and the fast delay line, respectively, of FIG. 2B.

In FIG. 6A, the rising edge of the received phase-encoded digital data signal in slow delay line 225 is shown at the input of delay gate 8S. To reach that point, the received phase-encoded digital data signal has been in the line for 600 ps, based on the three delay gates before the decoding section each having a 200 ps delay. At 600 ps, the same point in fast delay line 235 has reached the input of delay gate 5F. The rising edge in slow delay line 225 at the input of delay gate 8S clocks the corresponding signal level at the input of delay gate 8F, thus causing DREG 318 to latch a zero, indicating no error.

Figure 6B:
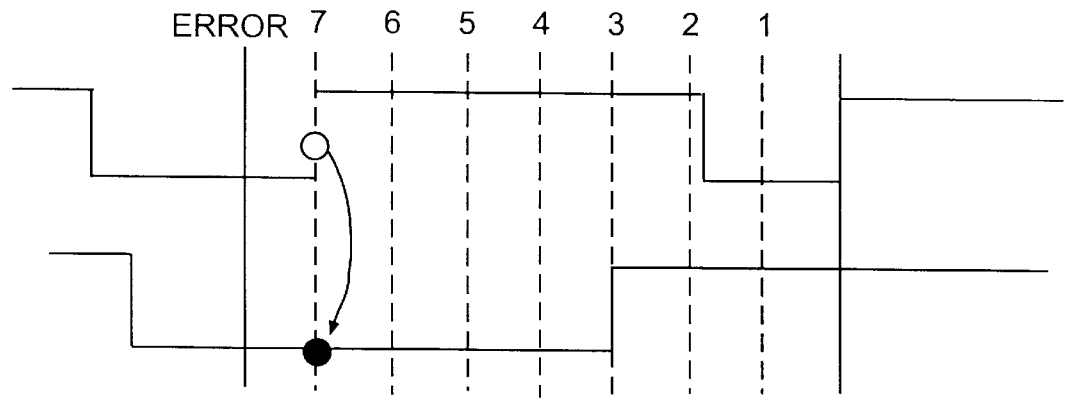

FIG. 6B shows the state of the signal in each delay line after 200 ps. The rising edge has passed to the input of delay gate 7S. Since the delay in fast delay line 235 is half that of slow delay line 225, the rising edge has reached the input of delay gate 3F. In addition, as shown in the figure, the falling edge of the phase-encoded digital data signal has entered both delay lines. For a phase encoding of "4," the falling edge occurs at the 750 ps point of the received phase-encoded digital data signal. Therefore, since 800 ps have passed since the received phase-encoded digital data signal entered the delay lines and the signal period is 1400 ps, 150 ps of the falling edge has entered each delay line. At this point, DREG 317 latches the zero value of the signal at the input of delay gate 7F.

Figure 6C:
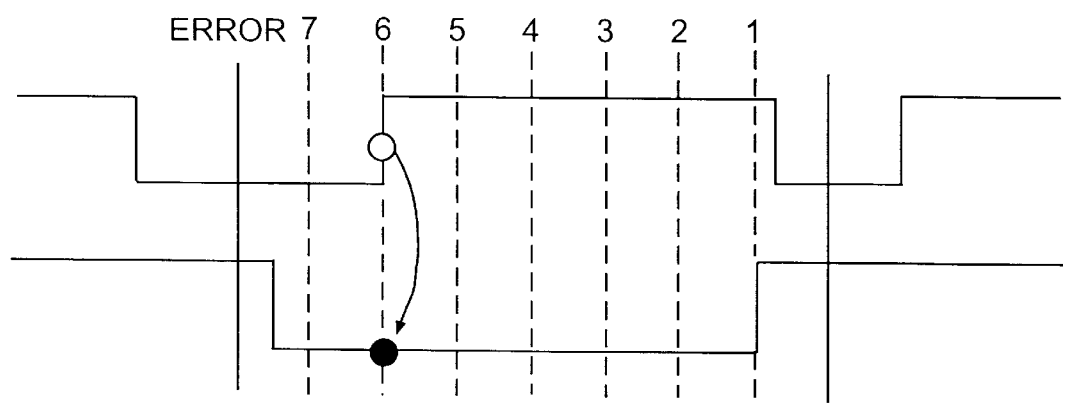
Figure 6D:
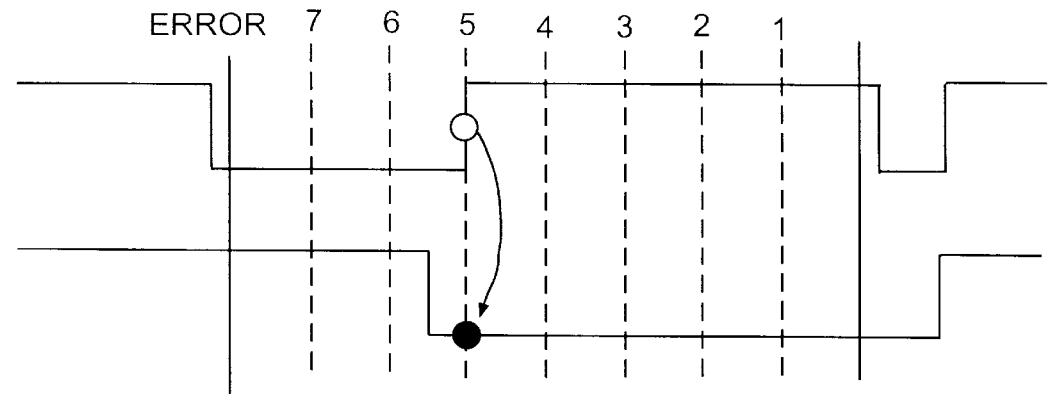

FIGS. 6C and 6D show the state of the signal in each delay line after the next two 200 ps periods. For the reasons discussed above, DREGs 316 and 315 also latch a low signal.

Figure 6E:
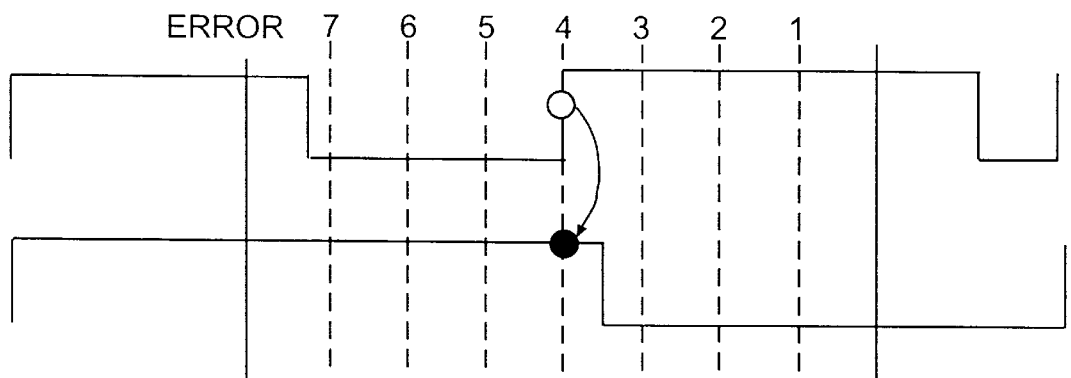
Figure 6F:
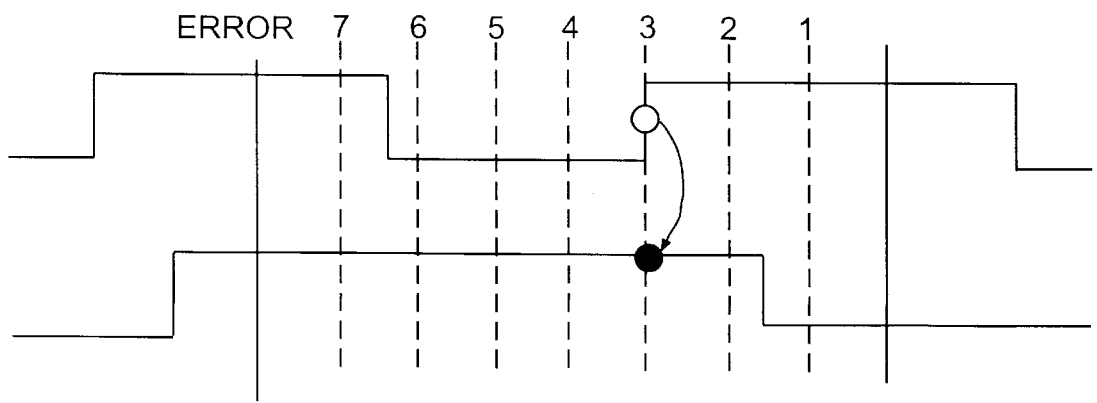

In FIG. 6E, the rising edge has reached the input of delay gate 4S. At this point, however, the falling edge has passed the input of delay gate 4F. As a result, DREG 314 latches a "1." Similarly, DREG 313, as shown in FIG. 6F and DREGs 312 and 311 (not shown) also latch high signals.

The DREGs latch different values when the falling edge of the signal in fast delay line 235 (overtakes the rising edge of the signal in the slow delay line 225. The length of time needed for the falling edge in fast delay line 235 to overtake the rising edge in slow delay line 225 is proportional to the length of time between the rising edge and falling edge of the encoded signal. The longer the time, the lower the encoded value and thus the greater the number of stages of the delay lines that the signal passes before the falling edge of the signal in fast delay line 235 catches the rising edge in slow delay line 225.

FIGS. 7A–7D show binary representations of the signals and the corresponding Q-outputs from the DREGs in decoder logic circuit 240 based on the signal states shown in FIGS. 6C–6F, respectively. Each figure shows the binary state in fast delay line 235 at the inputs of delay gates 7F–1F, the binary state in slow delay line 225 at the inputs of delay gates 7S–1S, and the Q-output of DREGs 317–311 In each row, the value circled is the value of interest at that point. For example, in fast delay line 235, the value circled represents the signal level latched to the output of the DREG. In slow delay line 225, the value circled represents the rising edge of the phase-encoded signal. For the DREG output, the value circled represents the value of the signal in fast delay line 235 latched by the DREG.

In FIG. 7A, which corresponds to the status of the signals in FIG. 6C, the rising edge (represented by the circled "0/1") in slow delay line 225, is at the input of delay gate 6S and clocks the state of the signal in fast delay line 235 at the input of delay gate 6F. Here, the state of the signal in fast delay line 235 is low (0), so DREG 316 latches a low signal (0). The same situation occurs at FIG. 7B, which corresponds to FIG. 6D, where DREG 315, like DREG 316, latches a low signal (0).

FIG. 7C corresponds to the signals shown in FIG. 6E. At this point, the falling edge of the signal in fast delay line 235 has passed the rising edge in slow delay line 225. As a result, DREG 314 latches a high signal (1). FIG. 7D, corresponding to FIG. 6F, shows the same situation.

Based on this example of a received phase-encoded digital data signal encoding a value of 4, the Q-outputs for DREGS 317–311 are 0, 0, 0, 1, 1, 1, and 1, respectively. Referring back to FIG. 3, these output values cause only one OR gate, OR gate 324, to produce a low signal (0). Since only OR gate 324 produced a low signal output, NAND gates 333, 332, and 331 generate 1, 0, and 0, respectively. The binary value 100 equals a decimal value 4, the value encoded by the received phase-encoded digital data signal.

Figure 8:
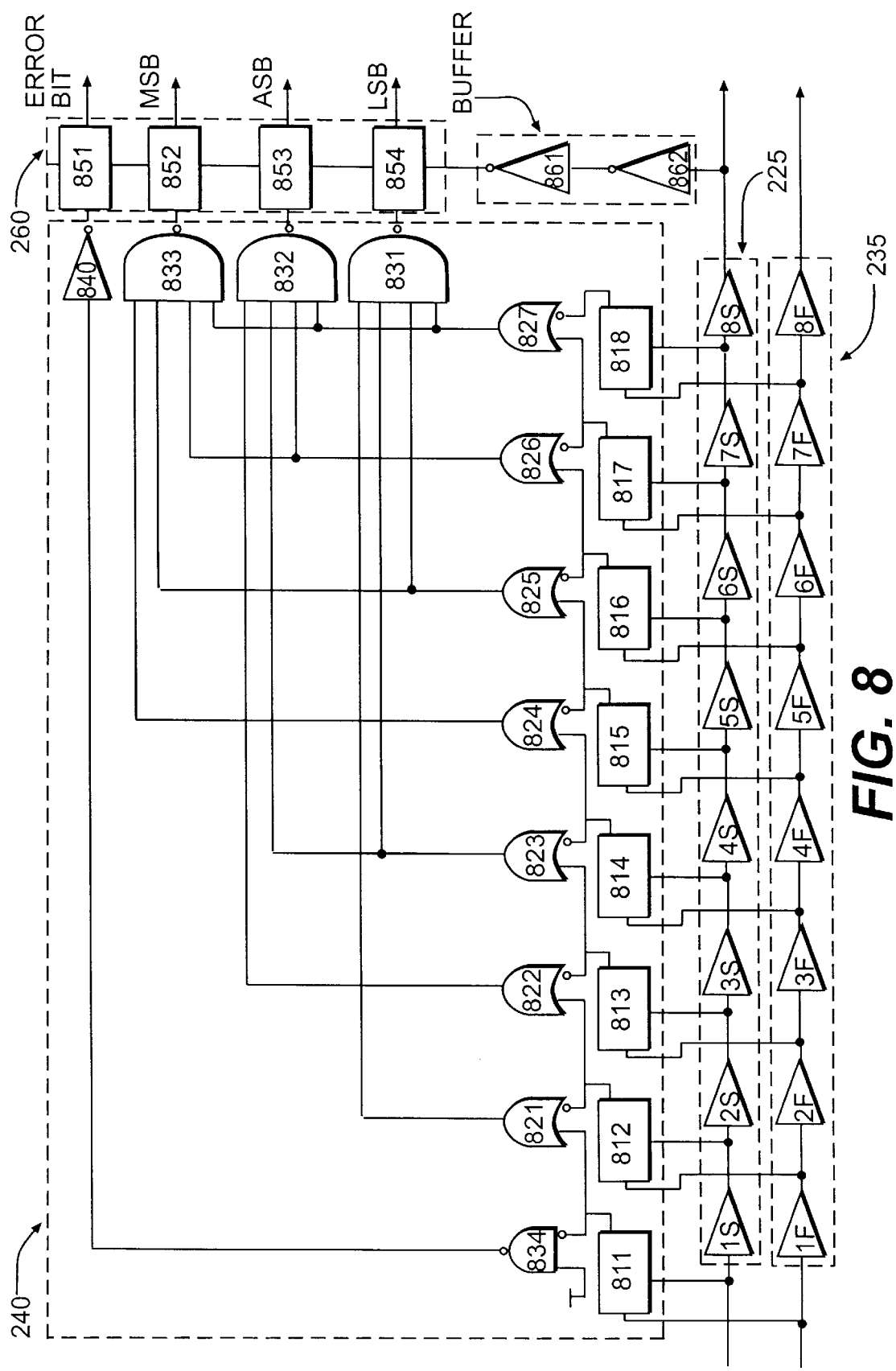
FIG. 8 is a detailed diagram of another implementation of the delay lines, decoder logic circuit, and data recovery circuit in FIG. 2B
Figure 9:
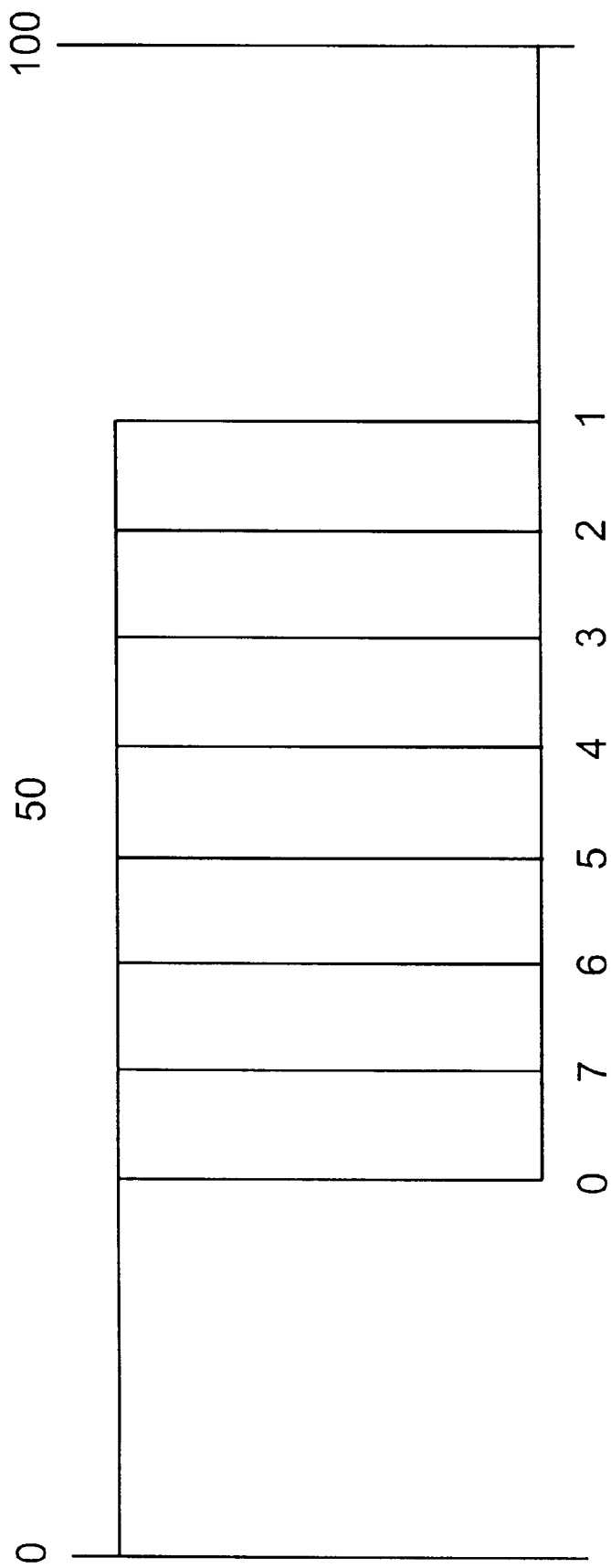
FIG. 9 is a diagram of a phase-encoded digital data signal with eight phase positions consistent with the circuitry in FIG. 8.

FIG. 8 shows another embodiment of a decoder circuit. In this embodiment, the phase-encoded signals decoded by the circuit encode signals opposite to the phase-encoded signals encoded for the circuit in FIG. 3. In particular, FIG. 9 shows a phase-encoded digital data signal with encodings for 0 and 7-1. In contrast to FIG. 1A, increasing the duty cycle of a phase-encoded digital data signal results in a signal encoding a lower binary data value.

The circuit shown in FIG. 8 is almost identical to the circuit shown in FIG. 3, and operates in the same fashion. The connections of the OR gates to the NAND gates in decoder logic circuit 240 constitute the only differences between the circuit in FIG. 8 and the circuit in FIG. 3. For example, whereas the output of the leftmost OR gate in FIG. 3 (OR gate 327) connects to the inputs of each NAND gate in decoder logic circuit 240, the output of the leftmost OR gate in FIG. 8 (OR gate 821) only connects to NAND gate 831.

The circuit in FIG. 8, receiving the phase-encoded digital data signal applied to FIG. 3 as shown in FIGS. 6A–6F, would produce the same output in the data recovery circuit 260, i.e. a binary value of 100 representing a decimal value of 4. However, for phase-encoded digital data signals with duty cycles encoding values 1–3 and 5–7 as shown in FIG. 1B, the circuits would produce complementary results. For example, if the circuit in FIG. 3 received a phase-encoded digital data signal with a duty cycle encoding a value of 6 as shown in FIG. 1B, the circuit would produce a binary value of 110 representing a decimal value of 6. In contrast, the circuit in FIG. 8, receiving a phase-encoded digital data signal with the same duty cycle would produce a binary value of 010 representing a decimal value of 2.

Figure 10:
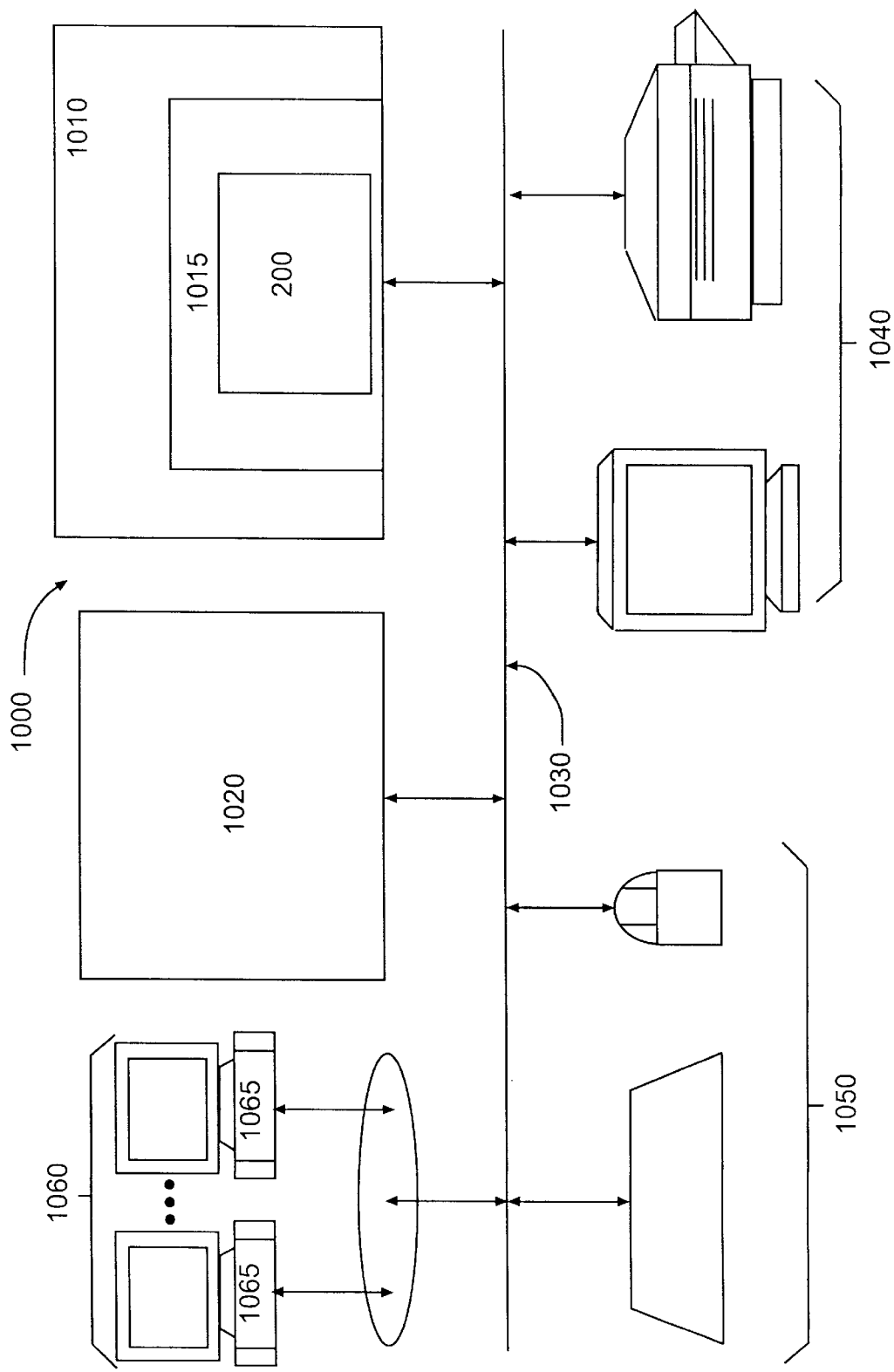
FIG. 10 is a diagram of a computer system including a decoder circuit according to the present invention.

FIG. 10 shows a diagram of a computer system 1000 using the decoder logic of decoder 200. Decoder 200 provides a fast and accurate means of communication for a computer system in a data communication network, which is particularly useful for today's computer systems that must perform increasing numbers of operations in decreasing amounts of time.

Computer system 1000 includes a processor 1010 and memory 1020 coupled to processor 1010 through a bus 1030. Processor 1010 fetches from memory 1020 computer instructions and executes the fetched computer instructions. Processor 1010 also reads data from and writes data to memory 1020 and sends data and control signals through bus 1030 to one or more computer display devices 1040. Processor 1010 additionally receives data and control signals through bus 1030 from one or more computer user input devices 1050 in accordance with fetched and executed computer instructions. Processor 1010 also receives data and control signals through a network interface 1015, including phase-encoded digital data signals, from one or more remote computers 1060 through a network interface 1065. Network interface 1015 includes a decoder 200 for decoding phase-encoded digital data signals received from remote computers 1060.

CONCLUSION

The decoder consistent with this invention decodes phase-encoded digital data signals by passing the phase-encoded digital data signal through delay lines having different delays or similar elements, without generating a separate clock. Instead, the decoder decodes the phase-encoded digital data signals with only the signals themselves.

It will be apparent to those skilled in the art that various modifications and variations can be made to disclosed embodiments of the present invention without departing from the scope or spirit of the invention. For example, decoder logic circuit 240 can be implemented using different logic, and the delay lines could be replaced by different elements that perform the clocking function described. Other embodiments of the invention will be apparent to those skilled in the art from consideration of the specification and practice of the embodiments of the invention disclosed herein. The specification and examples should be considered exemplary, with the true scope and spirit of the invention being indicated by the following claims and their full range of equivalents.

What is claimed is:

1. A decoder apparatus for decoding a phase-encoded digital data signal comprising:
   a first delay line receiving the phase-encoded digital data signal;
   a second delay line operating at a different rate than the first delay line and receiving the phase-encoded digital data signal; and
   a decoder logic circuit, coupled to the first and second delay lines, configured to sample the phase-encoded digital data signal in the second delay line at times determined by the first delay line to extract a value encoded in the received phase-encoded digital data signal.

2. The decoder apparatus according to claim 1, further comprising:
   a data recovery circuit, coupled to the decoder logic circuit, for receiving and holding the value extracted by the decoder logic circuit.

3. The decoder apparatus according to claim 1, further comprising:
   a synchronizing circuit coupled to the inputs of the first and second delay lines to produce the phase-encoded digital data signal from a transmitted signal.

4. The decoder apparatus according to claim 3, wherein the synchronizing circuit includes
   jitter circuitry configured to eliminate jitter present in the received phase-encoded digital data signal.

5. The decoder apparatus according to claim 3, wherein the synchronizing circuit is one of a phase-locked loop and a delay-locked loop.

6. The decoder apparatus according to claim 1, wherein the decoder logic circuit includes
   circuitry configured to sample data at an edge of the received phase-encoded digital data signal in the first delay line.

7. The decoder apparatus according to claim 1, wherein the decoder logic circuit includes
   a plurality of registers for holding the sampled data.

8. The decoder apparatus according to claim 7, wherein the decoder logic circuit further includes
   encoding circuitry to encode a state of the registers as a binary number representing the value encoded in the received phase-encoded digital data signal.

9. The decoder apparatus according to claim 8, wherein the encoding circuitry includes
   a plurality of NAND gates and a plurality of OR gates.

10. The decoder apparatus according to claim 1, wherein the first delay line includes
    a first number of delay gates coupled in series; and
    the second delay line includes
    a first number of delay gates coupled in series.

11. The decoder apparatus according to claim 10, wherein the delay gates of the first delay line each impart a first delay and the delay gates of the second delay line each impart a second delay, and where the first delay is twice the second delay.

12. The decoder apparatus according to claim 11, further comprising
    delay control circuitry to adjust the first delay and the second delay.

13. The decoder apparatus according to claim 11, further comprising
    a synchronizing circuit configured to align the received phase-encoded digital data signal at the inputs of the first and second delay lines.

14. The decoder apparatus according to claim 7, wherein the plurality of registers have a clock input coupled to the first delay line and a data input coupled to the second delay line.

15. The decoder apparatus according to claim 14, wherein the first delay line includes
    a first number of delay gates coupled in series; and
    the second delay line includes
    a first number of delay gates coupled in series.

16. The decoder apparatus according to claim 15, wherein each of the registers corresponds to a different one of the delay gates in the first and second delay lines at the same relative position in the series of delay gates; and
    wherein the clock input of each of the registers connects to the input of the corresponding delay gate in the first delay line and the data input connects to the input of the corresponding delay gate in the second delay line.

17. The decoder apparatus according to claim 16, wherein a first register of the plurality of registers of the decoder logic circuit includes
    circuitry configured to latch to the first register an error condition of the received phase-encoded digital data signal.

18. The decoder apparatus according to claim 17, wherein the decoder logic circuit further includes
    encoding circuitry to encode the state of the registers except for the first register as a binary number representing the value encoded in the received phase-encoded digital data signal.

19. The decoder apparatus according to claim 18, wherein the encoder circuitry includes
    a plurality of NAND gates and a plurality of OR gates.

20. The decoder apparatus according to claim 19, further comprising:
    a data recovery circuit, coupled to the encoding circuitry, for receiving and holding the binary number and the error condition.

21. A computer system comprising:
    a memory;
    a processor, coupled to the memory, having a network interface which includes
      a decoder circuit for decoding a phase-encoded digital data signal including
        a first delay line receiving the phase-encoded digital data signal;
        a second delay line, operating at a different rate than the first delay line and receiving the phase-encoded digital data signal; and
        a decoder logic circuit, coupled to the first and second delay lines, configured to sample the phase-encoded digital data signal in the second delay line at times determined by the first delay line to extract a value encoded in the received phase-encoded digital data signal.

22. The decoder apparatus according to claim 21, further comprising:

a data recovery circuit, coupled to the decoder logic circuit, for receiving and holding the value extracted by the decoder logic circuit.

23. The decoder apparatus according to claim 21, wherein the decoder logic circuit includes circuitry configured to sample data at an edge of the received phase-encoded digital data signal in the first delay line.

24. The decoder apparatus according to claim 21, wherein the decoder logic circuit includes a plurality of registers for holding the sampled data.

25. The decoder apparatus according to claim 24, wherein the decoder logic circuit further includes encoding circuitry to encode the state of the registers as a binary number representing the value encoded in the received phase-encoded digital data signal.

26. The decoder apparatus according to claim 25, wherein the encoding circuitry includes a plurality of NAND gates and a plurality of OR gates.

27. The decoder apparatus according to claim 21, wherein the first delay line includes a first number of delay gates coupled in series; and
the second delay line includes
a first number of delay gates coupled in series.

28. The decoder apparatus according to claim 27, wherein the delay gates of the first delay line each impart a first delay and the delay gates of the second delay line each impart a second delay, and where the first delay is twice the second delay.

29. The decoder apparatus according to claim 24, wherein the plurality of registers have a clock input coupled to the first delay line and a data input coupled to the second delay line.

30. The decoder apparatus according to claim 29, wherein the first delay line includes a first number of delay gates coupled in series; and
the second delay line includes
a first number of delay gates coupled in series.

31. The decoder apparatus according to claim 30, wherein each of the registers corresponds to a different one of the delay gates in the first and second delay lines at the same relative position in the series of delay gates; and wherein the clock input of each of the registers connects to the input of the corresponding delay gate in the first delay line and the data input connects to the input of the corresponding delay gate in the second delay line.

32. The decoder apparatus according to claim 31, wherein a first register of the plurality of registers of the decoder logic circuit includes circuitry configured to latch to the first register an error condition of the received phase-encoded digital data signal.

33. The decoder apparatus according to claim 32, wherein the decoder logic circuit further includes encoding circuitry to encode a state of the registers except for the first register as a binary number representing the value encoded in the received phase-encoded digital data signal.

34. The decoder apparatus according to claim 33, wherein the encoder circuitry includes a plurality of NAND gates and a plurality of OR gates.

35. The decoder apparatus according to claim 33, further comprising:

a data recovery circuit, coupled to the encoding circuitry, for receiving and holding the binary number and the error condition.

36. A decoder apparatus for decoding a phase-encoded digital data signal comprising:

a timing circuit receiving the phase-encoded digital data signal;

a signal viewer circuit receiving the phase-encoded digital data signal; and a decoder logic circuit, coupled to the timing circuit and signal viewer circuit, configured to sample the phase-encoded digital data signal in the signal viewer circuit at times determined by the timing circuit to extract a value encoded in the received phase-encoded digital data signal.

37. The decoder apparatus according to claim 36, further comprising:

a data recovery circuit, coupled to the decoder logic circuit, for receiving and holding the value extracted by the decoder logic circuit.

38. The decoder apparatus according to claim 36, wherein the decoder logic circuit includes circuitry configured to sample data at an edge of the received phase-encoded digital data signal in the timing circuit.

39. The decoder apparatus according to claim 38, wherein the decoder logic circuit includes a plurality of registers for holding the sampled data.

40. The decoder apparatus according to claim 39, wherein the decoder logic circuit further includes encoding circuitry to encode the state of the registers as a binary number representing the value encoded in the received phase-encoded digital data signal.

41. The decoder apparatus according to claim 40, wherein the encoding circuitry includes a plurality of NAND gates and a plurality of OR gates.

42. The decoder apparatus according to claim 39, wherein the plurality of registers have a clock input coupled to the timing circuit and a data input coupled to the signal viewer circuit.

43. The decoder apparatus according to claim 42, wherein a first register of the plurality of registers of the decoder logic circuit includes circuitry configured to latch to the first register an error condition of the received phase-encoded digital data signal.

44. The decoder apparatus according to claim 43, wherein the decoder logic circuit further includes encoding circuitry to encode the state of the registers except for the first register as a binary number representing the value encoded in the received phase-encoded digital data signal.

45. The decoder apparatus according to claim 44, wherein the encoder circuitry includes a plurality of NAND gates and a plurality of OR gates.

46. The decoder apparatus according to claim 44, further comprising:

a data recovery circuit, coupled to the encoding circuitry, for receiving and holding the binary number and the error condition.

47. A method of decoding a phase-encoded digital data signal comprising the steps of:

receiving the phase-encoded digital data signal;

sampling portions of the phase-encoded digital data signal at times determined by a predetermined portion of the phase-encoded digital data signal; and extracting the value encoded in the phase-encoded digital data signal based on the sampled portions.

48. The method according to claim 47, wherein the sampling step includes the substep of indicating times for sampling portions of the phase-encoded digital data signal based on an edge of the phase-encoded digital data signal.

49. The method according to claim 47, wherein the sampling step includes the substep of delaying the phase-encoded digital data signal with a first number of serially-coupled gates in a first delay line and a first number of serially-coupled gates in a second delay line.

50. The method according to claim 49, wherein the first delaying step includes the substeps of imparting a first delay from each of the delay gates in the first delay line to the phase-encoded digital data signal; and imparting a second delay from each of the delay gates in the second delay line to the phase-encoded digital data signal, wherein the first delay is equal to twice the second delay.

51. The method according to claim 50, wherein the sampling step includes the substep of capturing the portion of the phase-encoded digital data signal at the input of a delay gate in the second delay line when the predetermined portion of the phase-encoded digital data signal reaches the input of the corresponding delay gate in the first delay line.

52. The method according to claim 50, wherein the setting step includes the substep of adjusting the total delay of the delay gates in the first delay line to equal twice the period of the phase-encoded digital data signal.

53. The method according to claim 47, wherein the extracting step includes the substep of encoding the extracted value as a binary number representing the value encoded in the phase-encoded digital data signal.

54. The method according to claim 47, further comprising the step of determining an error condition of the phase-encoded digital data signal based on the value of one of the sampled portions.

55. The method according to claim 51, wherein the capturing step includes the substeps of detecting a rising edge, formed by a beginning of the phase-encoded digital data signal and an end of a previously received phase-encoded digital data signal, at an input of a delay gate in the first delay line, and latching data at the input of a corresponding delay gate in the second delay line after detecting the rising edge at the input of the delay gate in the first delay line.

* * * * *

UNITED STATES PATENT AND TRADEMARK OFFICE
CERTIFICATE OF CORRECTION

PATENT NO. : 6,148,038

DATED: November 14, 2000

INVENTORS: Robert J. Drost and Robert J. Bosnyak

It is hereby certified that errors appear in the above-identified patent and that said Letters Patent is hereby corrected as shown below:

Claim 35, col. 11, line 65, delete "," second occurrence.

Signed and Sealed this

Twenty-ninth Day of May, 2001

*Attest:*

NICHOLAS P. GODICI

*Attesting Officer*     *Acting Director of the United States Patent and Trademark Office*